(12) United States Patent
Egashira

(10) Patent No.: US 6,345,947 B1
(45) Date of Patent: Feb. 12, 2002

(54) SUBSTRATE ARRANGING APPARATUS AND METHOD

(75) Inventor: Kouji Egashira, Tosu (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/187,513

(22) Filed: Nov. 5, 1998

(30) Foreign Application Priority Data

Nov. 10, 1997 (JP) .............................................. 9-325198

(51) Int. Cl.⁷ ................................................ B65H 1/28
(52) U.S. Cl. .................. 414/225.01; 414/222; 414/404; 414/416; 414/816; 414/937; 414/938
(58) Field of Search ........................... 414/225.01, 404, 414/416, 417, 222, 935, 936, 937, 938, 940, 816

(56) References Cited

U.S. PATENT DOCUMENTS

| | | | | |
|---|---|---|---|---|
| 5,354,995 A | * | 10/1994 | Endo et al. ................. | 414/331 |
| 5,374,153 A | * | 12/1994 | Nishi .......................... | 414/417 |
| 5,406,092 A | * | 4/1995 | Mokuo ....................... | 250/561 |
| 5,718,552 A | * | 2/1998 | Grutzediek et al. ......... | 414/937 |
| 5,730,162 A | * | 3/1998 | Shindo et al. ................ | 136/66 |
| 5,976,198 A | * | 11/1999 | Suhara et al. ............... | 29/25.01 |
| 6,074,515 A | * | 6/2000 | Iseki et al. ................... | 414/937 |

FOREIGN PATENT DOCUMENTS

JP          6-163500          6/1994

* cited by examiner

Primary Examiner—Joseph A. Fischetti
(74) Attorney, Agent, or Firm—Morrison & Foerster LLP

(57) ABSTRACT

A substrate arranging apparatus has a carrier support table 40 for supporting thereon carriers C holding a plurality of wafers in arranged in a row, first support mechanisms 42, 43 capable of moving upward relative to the table 40 to support the wafers contained in the carriers C, and a second support mechanism 60 capable of supporting the even or the odd wafers among the wafers supported by the first support mechanisms 60 and of raising the wafers supported thereon relative to the rest of the wafers. The first support mechanisms 42, 43 or the second support mechanism is able to turn through an angle of 180° relative to the other. As a result, the wafer are arranged in a front-to-front and back-to-back disposition. Thus, the carrier support table, the loader mechanism and the substrate arranging section are integrally combined and the time needed for the transfer of the wafers is shortened.

11 Claims, 18 Drawing Sheets

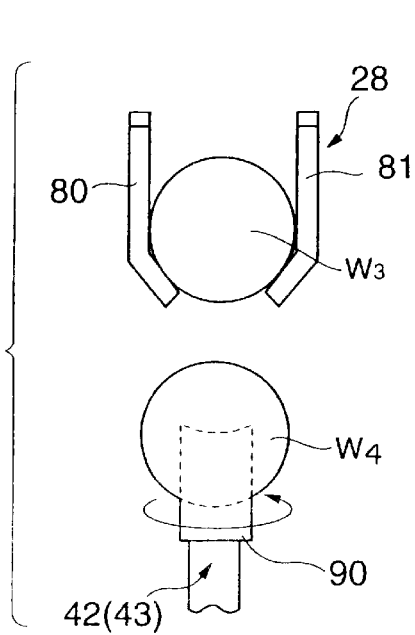
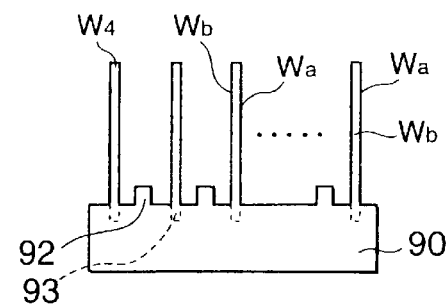
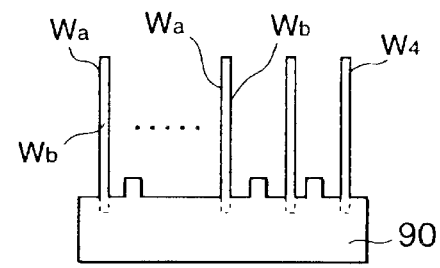
FIG. 25a
FIG. 25b
FIG. 25c
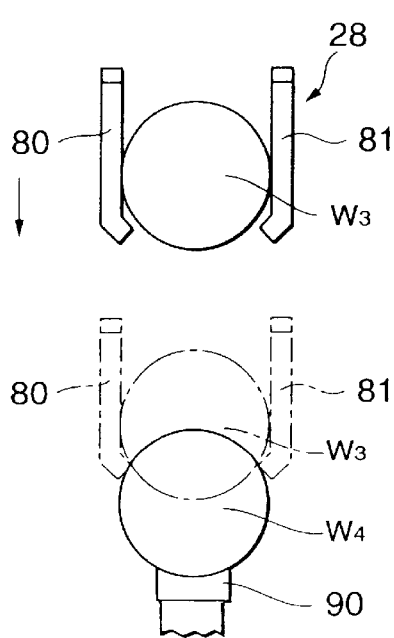
FIG. 26

SUBSTRATE ARRANGING APPARATUS AND METHOD

BACKGROUND OF THE INVENTION

1. Field of the Invention

The present invention relates to a substrate arranging apparatus and method for arranging substrates, such as semiconductor wafers in a front-to-front and back-to-back arrangement.

2. Description of the Related Art

In a cleaning process carried out in connection with processes of fabricating semiconductor devices, such as an LSI circuits, various cleaning systems have been used for removing contaminants, such as particles, organic contaminants, metallic impurities and the like, from the surfaces of semiconductor wafers, i.e., substrates. The wet cleaning system has particularly prevalently been used owing to its capability of effective removal of particles adhering to wafers and of cleaning wafers in a batch processing mode.

The cleaning system has a receiving section, a cleaning section and a delivery section. The receiving section has a carrier table for receiving thereon a carrier holding, for example, twenty-five wafers, a loading mechanism for handling the carrier holding the wafers, and an arranging device for arranging, for example, fifty wafers held on two carriers transferred thereto by the loading mechanism.

In the receiving section of the cleaning system, carriers are positioned on the carrier table, and then the carriers are conveyed by, for example, a conveying device. The loading mechanism pushes up the wafers from below the carriers to take out the wafers from the carriers and carries the wafers to the arranging section. The fifty wafers thus taken out of the carriers are arranged in a row in the arranging section to wait for processing.

A wafer chuck holds collectively the wafers arranged in the arranging section and carries the same to the cleaning section. The cleaning section is provided with cleaning tanks for collectively cleaning and drying the fifty wafers. In a cleaning process, the fifty wafers arranged at predetermined intervals in parallel to each other are immersed in a cleaning liquid. In the cleaning process, the cleaning liquid, such as a sulfuric acid solution, is supplied from the bottom of the first cleaning tank so as to overflow the first cleaning tank to clean the wafers by upward currents of the cleaning liquid. The wafers thus cleaned are transferred from the first cleaning tank to the second cleaning tank. For example, a rinsing liquid is supplied to the second cleaning tank so as to overflow the second cleaning talk to rinse the wafers. The wafers thus cleaned in those cleaning tanks are conveyed to the delivery section. In the delivery section, an unloading mechanism returns the wafers to carriers, and the carriers holding the cleaned wafers are delivered from the cleaning system.

A plurality of wafers contained in the carrier are arranged in a row at predetermined intervals in parallel to each other with the front surfaces thereof directed in the same direction; that is, the front surface of one of the wafers faces the back surface of the wafer adjacent thereto. The carrier thus holding the wafers with the front surfaces of all the wafers directed toward an operating side is carried to the cleaning system by, for example, a transport robot. Consequently, it is general to clean the wafers in the cleaning tank with their front surfaces directed in the same direction.

The front surface of the wafer is mirror-furnished in a smooth surface suitable for fabricating devices thereon and the front surface is supposed to be free from particles and the like. On the other hand, the back surface of the wafer is not mirror-finished and is rough as compared with the front surface. The back surface of the wafer is contaminated with a relatively large number of particles as compared with the front surface of the same. It often occurs that particles adhering to the back surfaces of the wafers separate from the back surfaces of the wafers, move in the cleaning liquid toward the front surfaces of adjacent wafers and adhere to the front surfaces of adjacent wafers when the wafers are loaded into the cleaning tank or during a cleaning operation in the cleaning tank because, as mentioned above, the wafers are arranged with their front surfaces directed in the same direction in a back-to-front arrangement. If the front surfaces of the wafers are contaminated with particles the yield rate of products is reduced accordingly.

A cleaning method proposed to prevent the transfer of particles from the back to the front surfaces of wafers in JP-6-1 63500A cleans all the wafers collectively after rearranging the wafers in a front-to-front arrangement by a substrate arranging unit. Since the respective front surfaces of adjacent wafers face each other, particles separated from the back surfaces of the wafers will not circulate round the wafers and will not adhere to the front surfaces of the wafers, so that the reduction of the yield rate due to contamination with particles can be prevented.

A conventional cleaning system suitable for carrying out the prior art cleaning method needs a receiving unit provided with three independent mechanisms, i.e., a carrier table, a loading mechanism and a substrate arranging mechanism, to rearrange wafers in a front-to-front arrangement, in which the respective front surfaces of adjacent wafers face each other and the respective back surfaces of adjacent wafers face each other. Accordingly, the receiving section provided with those three mechanisms of the conventional cleaning system needs a large space for installation. Since the receiving section includes those three mechanisms, time for transferring wafers from the one to the next mechanism is necessary in addition to time for handling carriers on the carrier table, transporting the wafers by the loading mechanism and reversing the alternate wafers for rearrangement by the substrate arranging mechanism. When those three mechanisms need a large space for installation, processing time spent by the receiving section increases accordingly, which makes the improvement of the throughput of the cleaning system difficult.

SUMMARY OF THE INVENTION

The present invention has been made in view of those problems and it is an object of the present invention to provide a substrate arranging apparatus and method using a table, a loading mechanism and a substrate arranging mechanism, in which the loading mechanism and the substrate arranging mechanism are combined structurally to reduce the space necessary for installing the table, the loading mechanism and the substrate arranging mechanism and to reduce the time necessary for handling the wafers.

According to an aspect of the present invention, a substrate arranging apparatus comprises a table for supporting thereon a carrier holding a plurality of substrates arranged in a row in a face-to-face disposition at constant intervals, a first support mechanism capable of moving upward relative to the table through the carrier on the table to raise and support the substrates contained in the carrier, a second support mechanism capable of supporting a first group of alternate substrates among the substrates supported by the first support mechanism and of raising the substrates of the first group supported thereon relative to a second group of substrates consisting of the rest of the substrates, and rotating means for rotating one of the first support mechanism and the second support mechanism through an angle of 180° relative to the other.

When the carrier is mounted on the table, the first support mechanism moves upward relative to the table to support a plurality of substrates contained in the carrier thereon. Then, the second support mechanism moves upward relative to the first support mechanism to support thereon the first group of substrates among those supported on the first support mechanisms. Thus, the substrates are divided in half into the second group of substrates supported on the first support mechanism and the first group of substrates supported on the second support mechanism. The first support mechanism or the second support mechanism is turned through an angle of 180° relative to the other to reverse the substrates supported on one of the support mechanisms. Then, for example, the first support mechanism is raised relative to the second support mechanism to dispose the plurality of substrates in a front-to-front and back-to-back arrangement in which the respective front surfaces of adjacent substrates face each other and the respective back surfaces of adjacent substrates face each other.

According to another aspect of the present invention, there is provided a substrate arranging method comprising the steps of: placing a carrier holding a plurality of substrates arranged in a row in a face-to-face disposition at constant intervals; moving up a first support mechanism relative to the carrier to support the substrates in the carrier on the first support mechanism; selectively supporting a first group of alternate substrates among the substrates by a second support mechanism to cause a second group of substrates consisting of the substrates other than the substrates of the first group to remain on the first support mechanism; moving the first and second support mechanisms relative to each other to bring one of the groups of the substrates to a non-interfering position at which the one group of the substrates does not interfere with the other group of the substrates; rotating one of the second support mechanism supporting the first group of the substrates and the first support mechanism supporting, the second group of the substrates relative to each other through an angle of 180° about a vertical axis, with the one group of the substrates at said non-interfering position; and moving the first and second support mechanisms relative to each other to combine the first group of the substrates and the second group of the substrates into a unified group of substrates arranges in a line.

According to a further aspect of the present invention, there is provided a substrate arranging method comprising the steps of: placing on a table a carrier holding a plurality of substrates; moving up a first support mechanism relative to and through the carrier on the table; supporting the substrates on the first support mechanism in a row and in a face-to-face disposition at constant intervals; selectively supporting on a second support mechanism a first group of substrates consisting of alternate substrates among the substrates supported on the first support mechanism; moving the first and second support mechanisms relative to each other to retain a second group of substrates other than the first group of the substrates on the first support mechanism and to move the first group of the substrates and the second group of the substrates to mutually non-interfering positions; rotating one of the second support mechanism supporting the first group of the substrates and the first support mechanism supporting the second group of the substrates relative to each other through an angle of 180° about a vertical axis, with the groups of the substrates at the non-interfering positions; moving the first and second support mechanisms relative to each other to combine the first group of the substrates and the second group of the substrates into a unified group of substrates and to support the unified group of substrates on the first support mechanism in a row in a face-to-face disposition at constant intervals; and moving down the first support mechanism relative to and through the carrier on the table to retain the unified group of substrates in the carrier.

The above and other objects, features and advantages of the present invention will become more apparent from the following description taken in connection with the accompanying drawings.

BRIEF DESCRIPTION OF THE DRAWINGS

FIGS. 25a, 25b and 25c are diagrammatic views explaining a fifth operation of the substrate arranging apparatus in the second embodiment;

FIG. 26 is a diagrammatic view explaining a sixth operation of the substrate arranging apparatus in the second embodiment;

DESCRIPTION OF THE PREFERRED EMBODIMENTS

The present invention will be described as applied to substrate arranging apparatuses to be used in a cleaning system capable of cleaning fifty semiconductor wafers in a batch processing mode.

Figure 1:
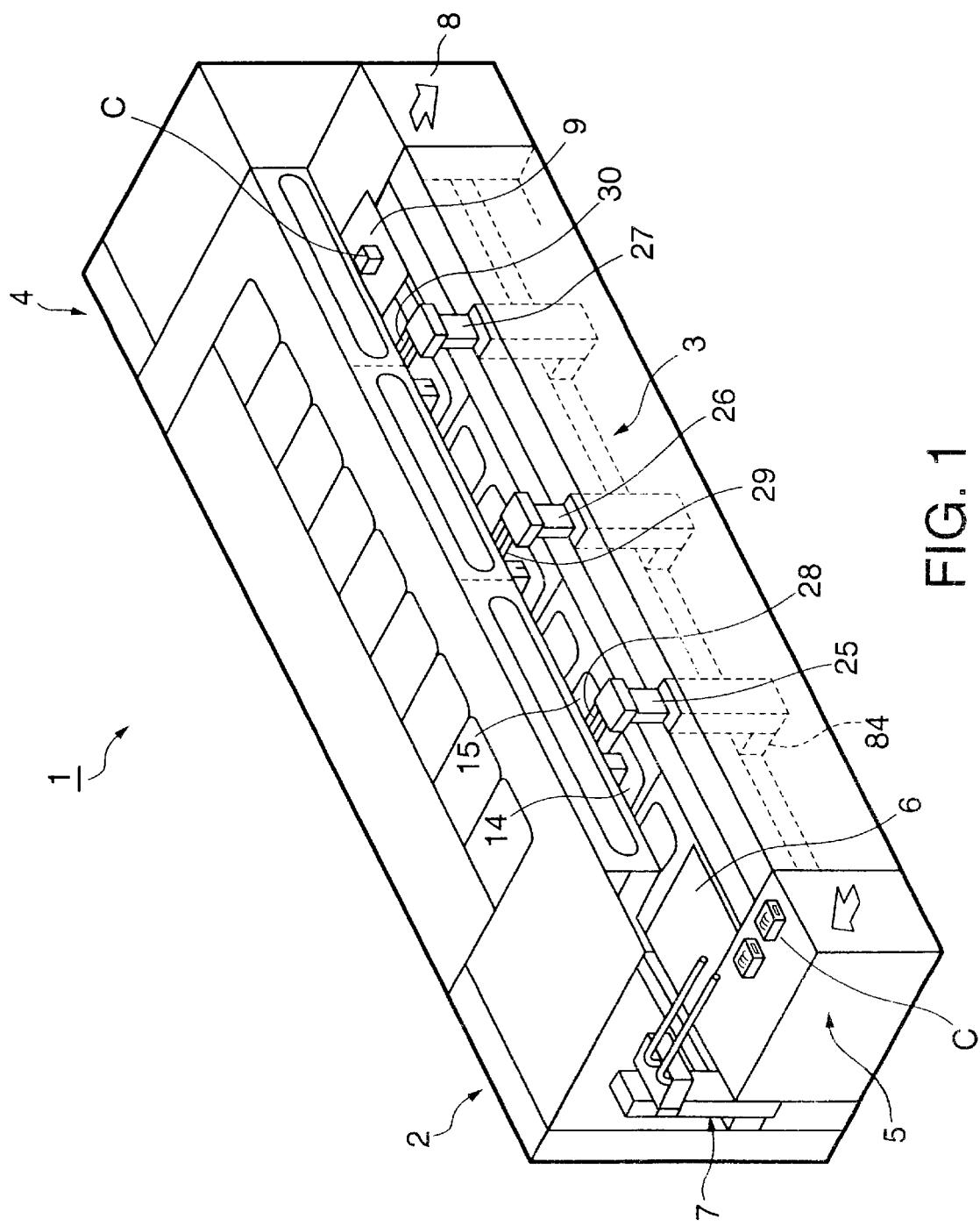
FIG. 1 is a perspective view of a cleaning system provided with a substrate arranging apparatus in a preferred embodiment of the present invention.

Referring to FIG. 1, a cleaning system 1 has three zones provided, respectively, with a receiving section 2 for receiving carriers C each containing a plurality of uncleaned substrates or semiconductor wafers W, a cleaning section 3 for processing the plurality of wafers (fifty uncleaned wafers W in this example), in a batch processing mode by cleaning processes, and a delivery section 4 for delivering carriers C containing cleaned wafers W.

Figure 2:
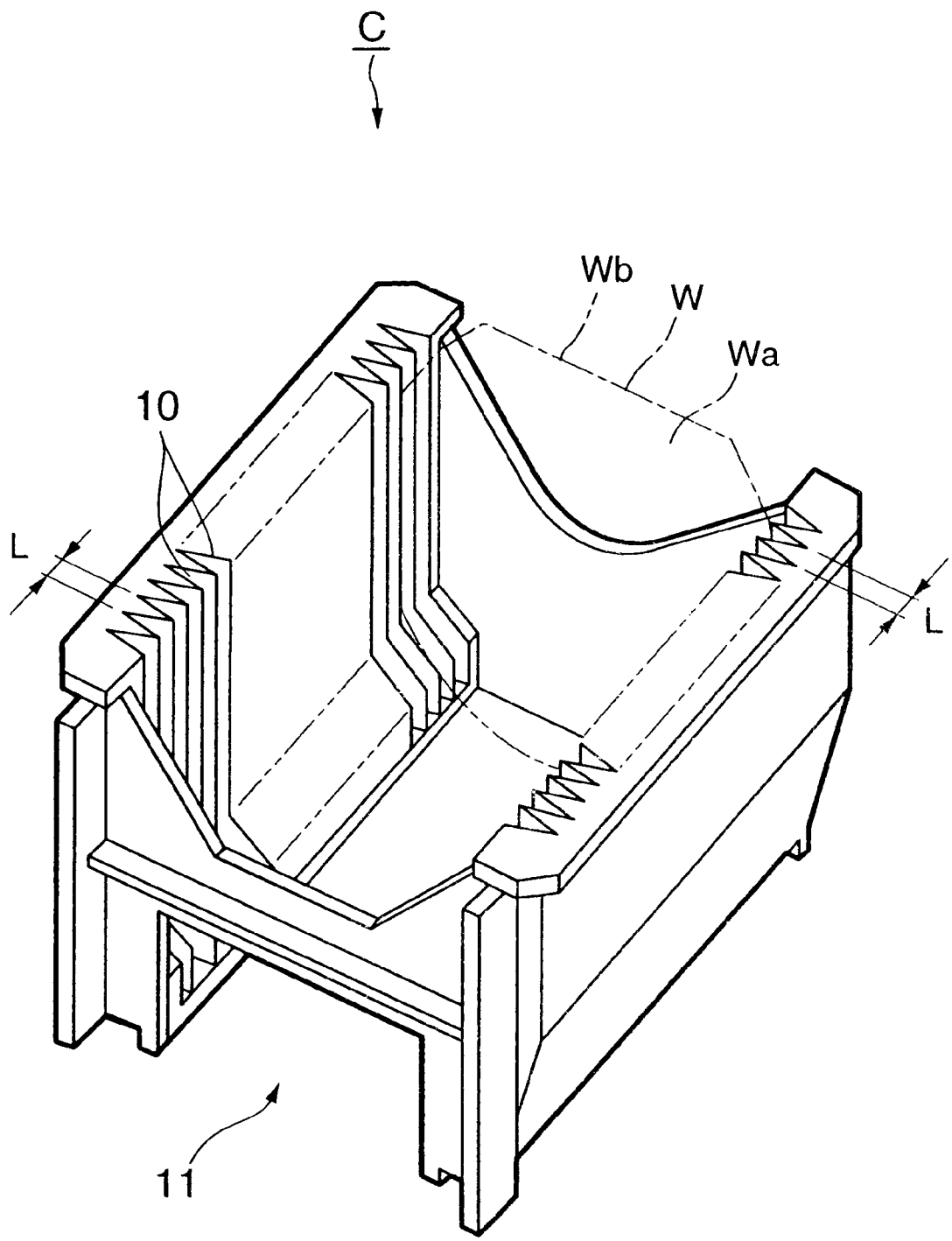
FIG. 2 is a perspective view of a carrier.

Referring to FIG. 2, the carrier C contains half of the plurality of wafers W, i.e., twenty-five parallel wafers W in this example. The carrier C has opposite walls and twenty-five parallel grooves 10 for holding the wafers W in a vertical attitude. The grooves 10 are formed in the inner surface of each of the opposite walls so that the grooves 10 of the opposite walls correspond to each other. The grooves 10 are arranged at equal intervals L (for example, equal intervals of 6.35 mm for holding 8in. wafers). The carrier C holds the twenty-five wafers W in a row at the equal intervals L in parallel to each other. All the wafers W are held in the carrier C with their front surfaces Wa directed forward (toward the front side in FIG. 2) and their back surfaces Wb directed backward (toward the back side in FIG. 2). The carrier C has an open lower end 11. As will be described later, first support mechanisms 42 and 43 (FIG. 3) are raised relative to the carriers C through the open lower ends 11 into the carriers C to raise all the fifty wafers W simultaneously. The carriers C each holding the twenty-five uncleaned wafers W are delivered to the receiving section 2, and the carriers C each containing twenty-five cleaned wafers processed by predetermined cleaning processes are delivered from the delivery section 4.

As shown in FIG. 1, the cleaning section 3 of the cleaning system 1 is provided with processing tanks including a cleaning chemical liquid tank 14 and a rinsing water tank 15. Three conveying devices 25, 26 and 27 are disposed on the operating side (front side) of the cleaning system 1. The conveying devices 25, 26 and 27 are provided with wafer chucks 28, 29 and 30, respectively. The delivery section 4 is provided with a carrier support table 8, an unloading mechanism, not shown, and a conveying device, not shown. The conveying devices 25, 26 and 27 holds the fifty wafers W taken out from the two carriers C by the wafer chucks 28, 29 and 30, and conveys the fifty wafers W from a substrate arranging apparatus 6 installed in the receiving section 2 sequentially via the processing tanks of the cleaning unit 3 to a substrate arranging apparatus 9 installed in the delivery section 4.

Figure 3:
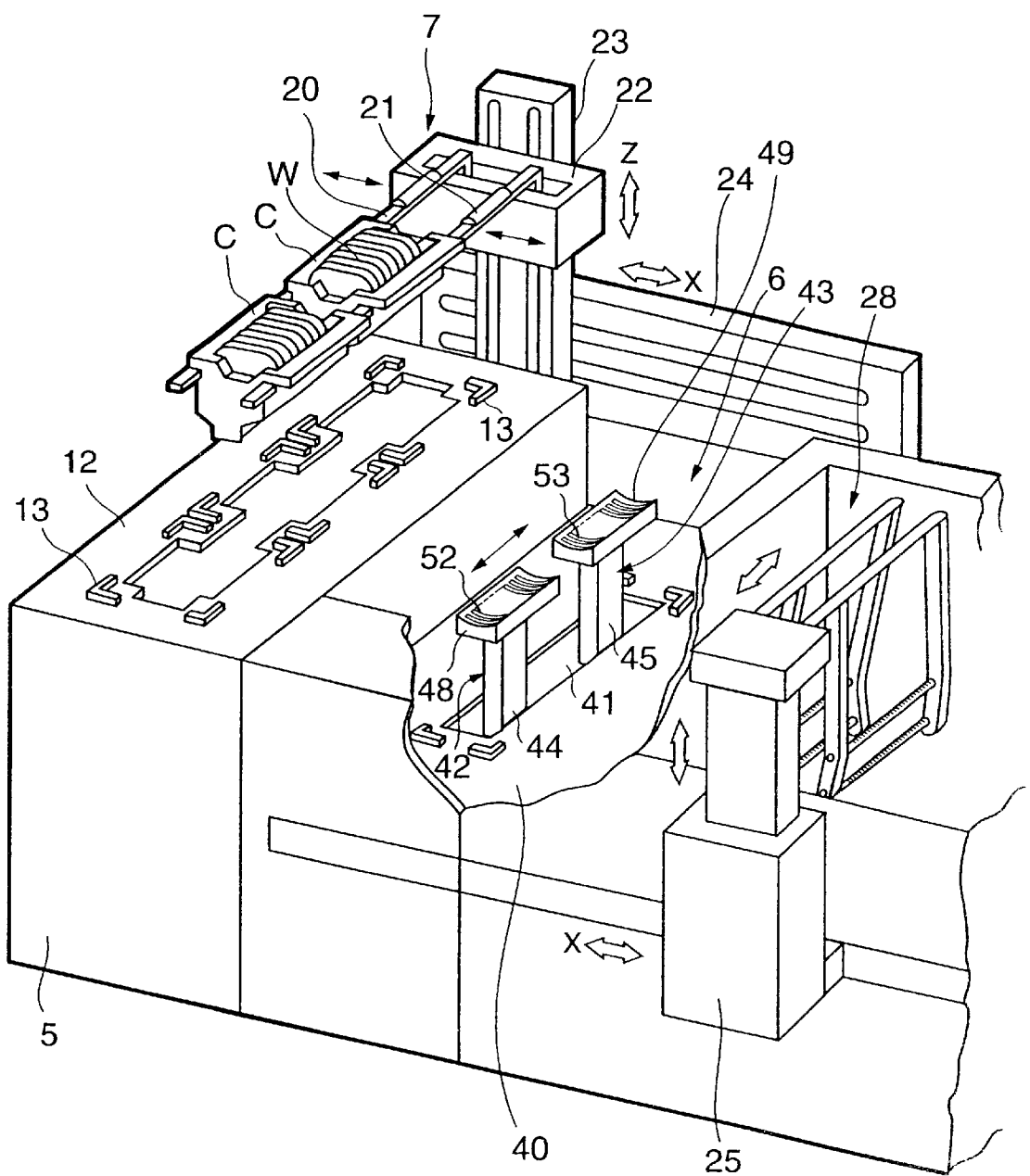
FIG. 3 is a perspective view of a receiving section included in the cleaning system of FIG. 1.

As shown in FIGS. 1 and 3, the receiving section 2 of the cleaning system 1 is provided with a carrier support table 5. Carriers C each containing twenty-five wafers W are delivered to and placed on the carrier support table 5. A plurality of substantially L-shaped positioning members 13 are fixed on a stage 12 placed on top of the carrier support table 5 to correctly position the carriers C on the stage 12. A conveying device is installed near the carrier support table 5 to convey the carriers C mounted on the carrier support table 5 to the neighboring substrate arranging apparatus 6. The conveying device 7 has a pair of arms 20 and 21 capable of being moved toward and away from each other, a lifter 22 for supporting the arms 20 and 21 in a horizontal position, a Z-axis base 23 along which the lifter 22 is moved vertically, i.e., along a Z-axis, and an X-axis base 24 along which the Z-axis base 23 moves longitudinally of the cleaning system 1, i.e., along an X-axis. The arms 20 and 21 holds the two carriers C mounted on the carrier support table 5 therebetween and conveys the two carriers C to a predetermined position in the substrate arranging apparatus 6.

The substrate arranging apparatus 6 of the cleaning system 1 is provided with a substrate arranging apparatus in a first embodiment of the present invention. Referring to FIGS. 3 to 6, the substrate arranging apparatus comprises a table 40 onto which the two carriers C held between the arms 20 and 21 is conveyed, the aforementioned first support mechanisms 42 and 43 which are raised relative to the carriers C through the open lower ends 11 into the carriers C to raise and hold all the fifty wafers W simultaneously, and a second support mechanism 60 which holds simultaneously the alternate wafers W of a first groove among those held by the first support mechanisms 42 and 43.

Figure 5:
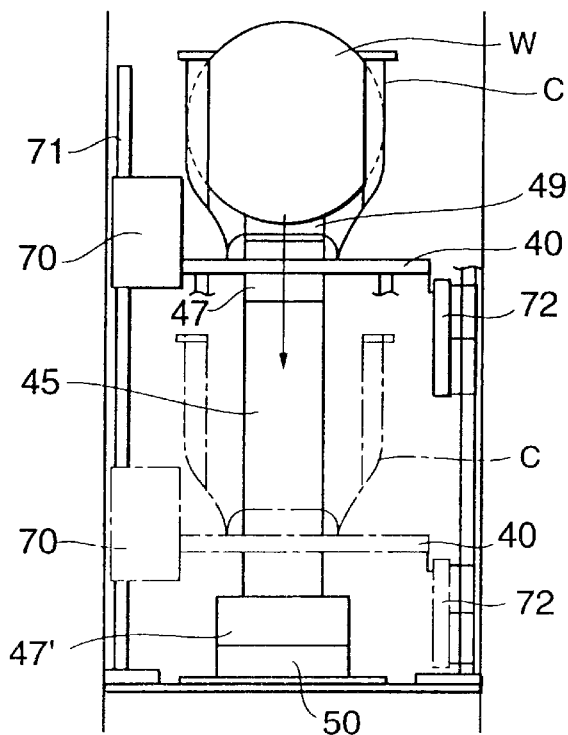
FIG. 5 is a front view of a table and a first support mechanism included in the substrate arranging apparatus shown in FIG. 4.

The table 40 is held horizontally and two carriers C each containing twenty-five uncleaned wafers W are mounted on the top surface of the table 40. The table 40 is provided in its central part with a central opening 41. First support members 48 and 49 are moved vertically through the central opening 41. As shown in FIG. 5, one end of the table 40 is attached to a lifting member 70 capable of vertically moving along a rail 71, and the other end of the table is connected to a linear motion guide 72. The lifting member 70 is operated to move the table 40 down from a normal upper position indicated by continuous lines to a lower position indicated by alternate long and short dash lines. The carriers C are lowered as the table 40 is moved downward and, consequently, halves of the fifty wafers W contained in the carriers C are held by the first support members 48 and 49, respectively.

The first support mechanisms 42 and 43 have posts 44 and 45, respectively. The lower ends of the posts 44 and 45 are attached to bases 50 and 51, respectively. Rotating mechanisms 46 and 47 capable of turning through an angle of 180° in a horizontal plane are connected to the upper ends of the posts 44 and 45 and the first support members 48 and 49 are held on the rotating mechanisms 46 and 47, respectively. The first support members 48 and 49 are formed so as to be able to pass through the lower open ends 11 of the carriers C. When the lifting member 70 is lowered to move the table 40 downward, the first support mechanisms 42 and 43 are raised relative to the table 40 and the first support members 48 and 49 pass upward through the central opening 41 of the table 40.

The first support members 48 and 49 are provided in their upper surfaces with parallel holding grooves 52 and 53 for receiving lower peripheral portions of the wafers W, respectively, to support the wafers thereon. The holding grooves 52 and 53 are formed at equal intervals equal to the intervals L between the grooves 10 of the carriers C. Therefore, the first support mechanisms 42 and 43 rise relative to the carriers C as the table 40 is lowered, whereby the twenty-five wafers W held on each of the carriers C are transferred from the carriers C to the first support members 48 and 49 of the first support mechanisms 42 and 43. The wafers W are held in a vertical attitude in the holding grooves 52 and 53.

Figure 4:
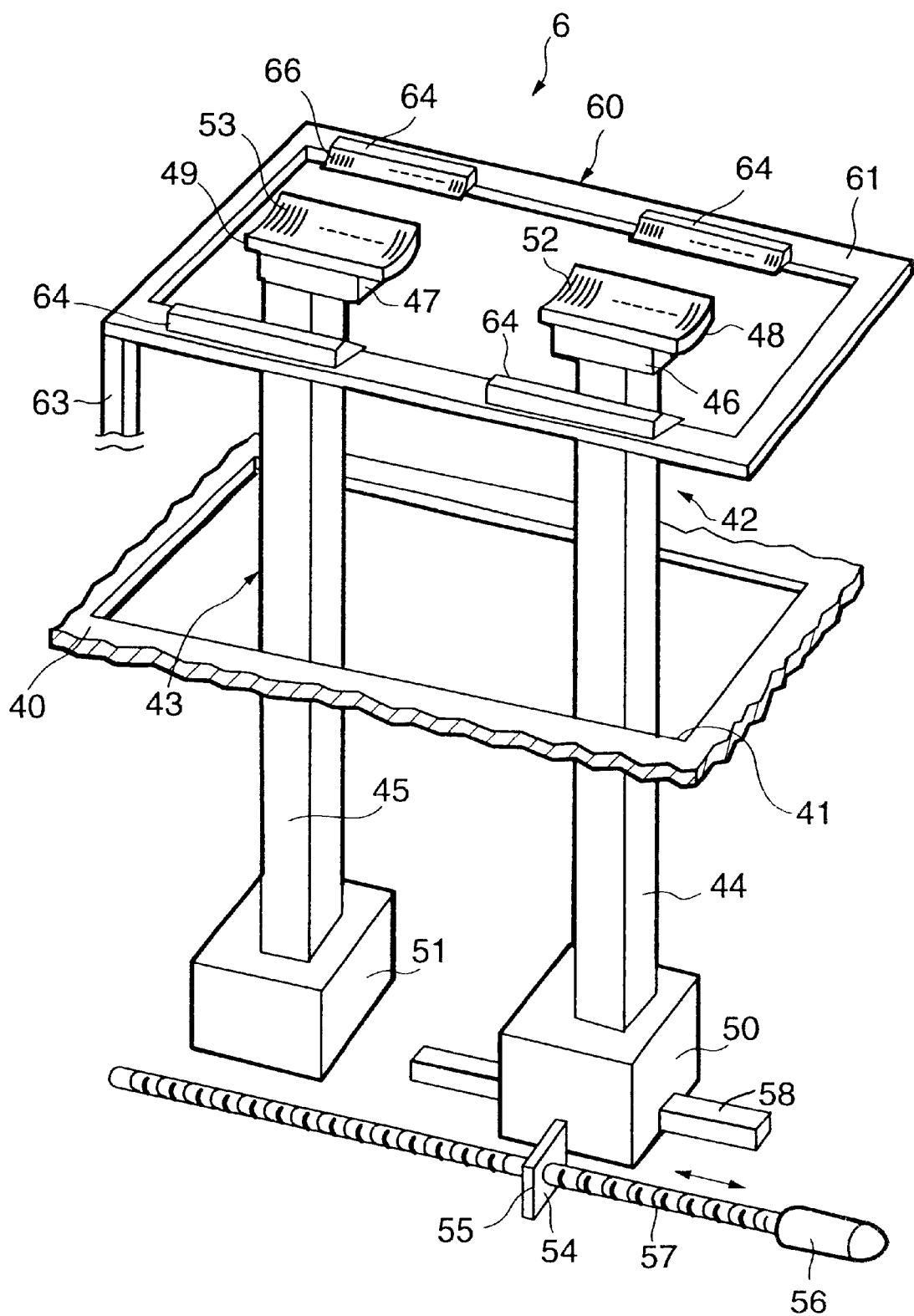
FIG. 4 is a perspective view of the substrate arranging apparatus of the present invention installed in the receiving section.

As shown in FIG. 4, a lug 54 provided with a threaded hole 55 is attached to a side surface of the front base 50 supporting the front post 44, and a screw shaft 57 is screwed in the threaded hole 55. A motor 56 drives the screw shaft 57 for rotation in the normal or the reverse direction to move the front base 50 on a rail 58 in directions indicated by the arrows in FIG. 4, whereby the front first support mechanism 42 can be moved toward the back first support mechanism 43 so that the first support members 48 and 49 of the first support mechanisms 42 and 43 come close to each other.

Figure 6:
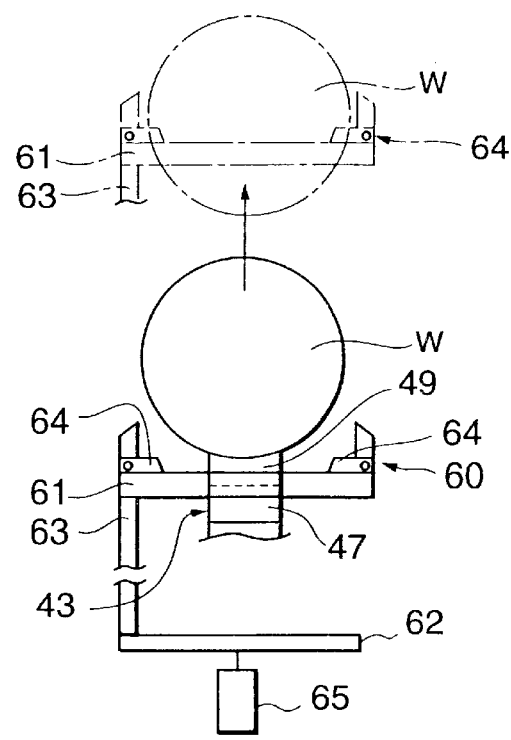
FIG. 6 is a front view of a second support mechanism included in the substrate arranging apparatus shown in FIG. 4.

The substrate arranging apparatus 6 is provided with the second support mechanism 60. Referring to FIGS. 4 and 6, the second support mechanism 60 has a horizontal frame 61 disposed in parallel to and above the table 40, vertical columns 63 supporting the horizontal frame 61, and two pairs of second support members 64 disposed on opposite frame members of the horizontal frame 61, respectively. As shown in FIG. 6, the lower ends of the vertical columns 63 are connected to a bracket 62, and an operating rod included in a cylinder actuator 65 is connected to tile bracket 62. The cylinder actuator 65 moves the second support mechanism 60 vertically relative to the first support mechanisms 42 and 43 between a lower position indicated by continuous lines and an upper position indicated by alternate long and short dash lines.

Figure 7:
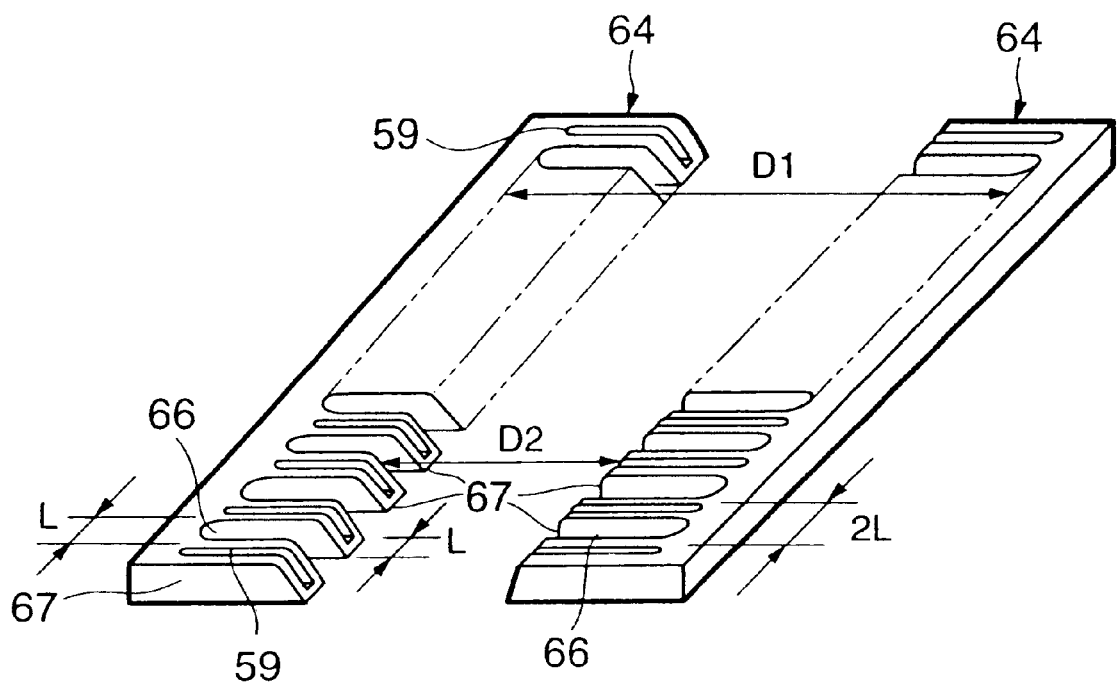
FIG. 7 is an enlarged perspective view of second support members included in the second support mechanism shown in FIG. 6.

When the second support mechanism 60 is raised to the upper position, half of the fifty wafers W held on the first support members 48 and 49, i.e., the twenty-five wafers W, are held simultaneously by the two pairs of second support members 64 of the second support mechanism 60. As shown in FIG. 7, each of the second support members 64 has a comb-shaped surface. The opposite second support members 64 are mirror images each other. Each second support member 64 is provided with alternate thirteen parallel grooves 66 and parallel projections 67. The intervals between the grooves 66 and the intervals of the projections 67 are 2L, which are twice the intervals L between the holding grooves 52 and 53 of the first support members 48 and 49. The projections 67 are provided with holding grooves 59 for receiving peripheral portions of the wafers W. Center distance between each holding groove 59 and adjacent groove 66 is L.

The length D1 of a space between the closed ends of the corresponding grooves 66 of the opposite second support members 64 is greater than the diameter of the wafers W, and the length D2 of a segment between the extremities of the corresponding projections 67 of the opposite second support members 64 is smaller than the diameter of the wafers W. Thus, the wafers W can be held in the holding grooves 59 of the opposite projections 67 and can pass through the spaces between the opposite grooves 66. Referring to FIG. 6, when the second support mechanism 60 is raised relative to the first support members 48 and 49, alternate ones of the fifty wafers W on the first support members 48 and 49 (twenty-five wafers W on each of the first support members 48 and 49) are supported on the holding grooves 59 of the opposite projections 67.

Figure 8A:
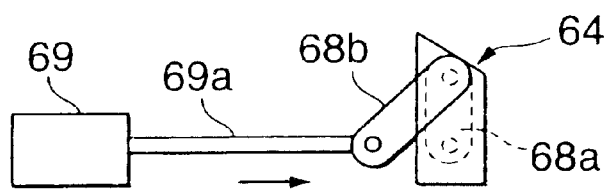
FIGS. 8a and 8b are schematic side views of assistance in explaining a linkage connected to the second support member shown in FIG. 7.
Figure 8B:
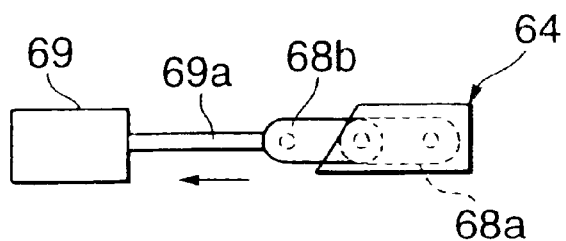

Referring to FIGS. 8a and 8b, a link 68a is attached to each of the second support members 64, and one end of a link 68b is pivotally connected to the link 68a. The other end of the link 68b is connected to a piston rod 69a included in a cylinder actuator 69. When the cylinder actuator 69 is operated to project the piston rod 69a toward the link 68a, the link 68a is set in an upright position and the second support member 64 is set in an open position as shown in FIG. 8a. When the piston rod 69a of the cylinder actuator 69 is retracted, the link 68a is set in a horizontal position and the second support, member 64 is set in a closed horizontal position as shown in FIG. 8b.

The operation of the substrate arranging apparatus in the first embodiment of the present invention thus constructed will be described below with reference to FIGS. 9, 10, 12 and 13.

Two carriers C each containing twenty-five uncleaned wafers W are transported and placed on the carrier support table 5 by, for example, a transport robot. All the twenty-five uncleaned wafers W are held in the carrier C with their front surfaces Wa directed forward (toward the front side in FIG. 2). The carriers C are correctly positioned by the positioning members 13 on the carrier support table 5. The conveying device 7 holds the two carriers C simultaneously between the arms 20 and 21 thereof and conveys the two carriers C to and places the same on the table 40 of the substrate arranging apparatus 6.

Figure 9:
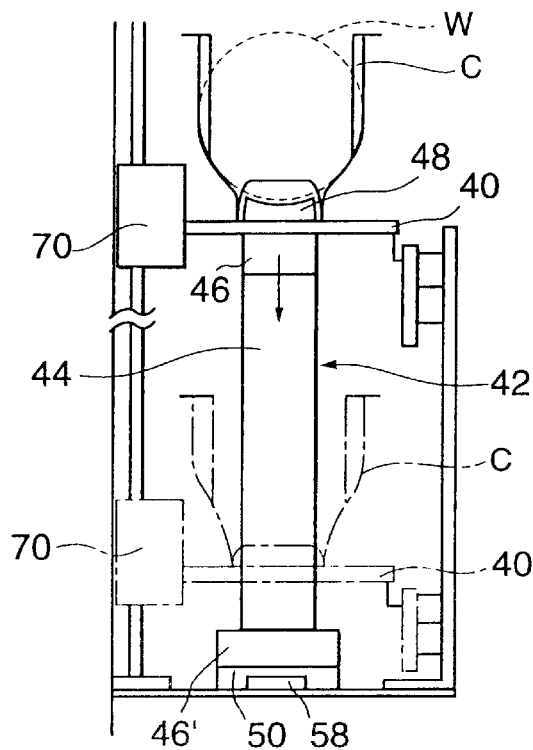
FIG. 9 is a schematic front view explaining a first operation of the substrate arranging apparatus shown in FIG. 4.

The table 40 supporting the carriers C thereon is lowered from the upper position indicated by continuous lines to the lower position indicated by alternate long and short dash lines in FIG. 9. As the table 40 moves downward, the first support members 48 and 49 rise relative to the table 40, pass through the central opening 41 of the table 40, enter the carriers C through the lower open ends 11 of the carriers C and halves of the fifty uncleaned wafers W contained in the two carriers C are held by the first support members 48 and 49, respectively.

Figure 10:
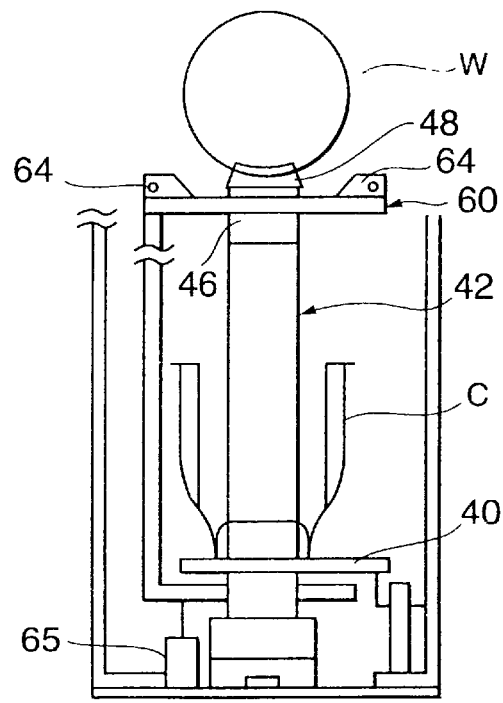
FIG. 10 is a schematic front, view explaining a second operation of the substrate arranging apparatus shown in FIG. 4.
Figure 11:
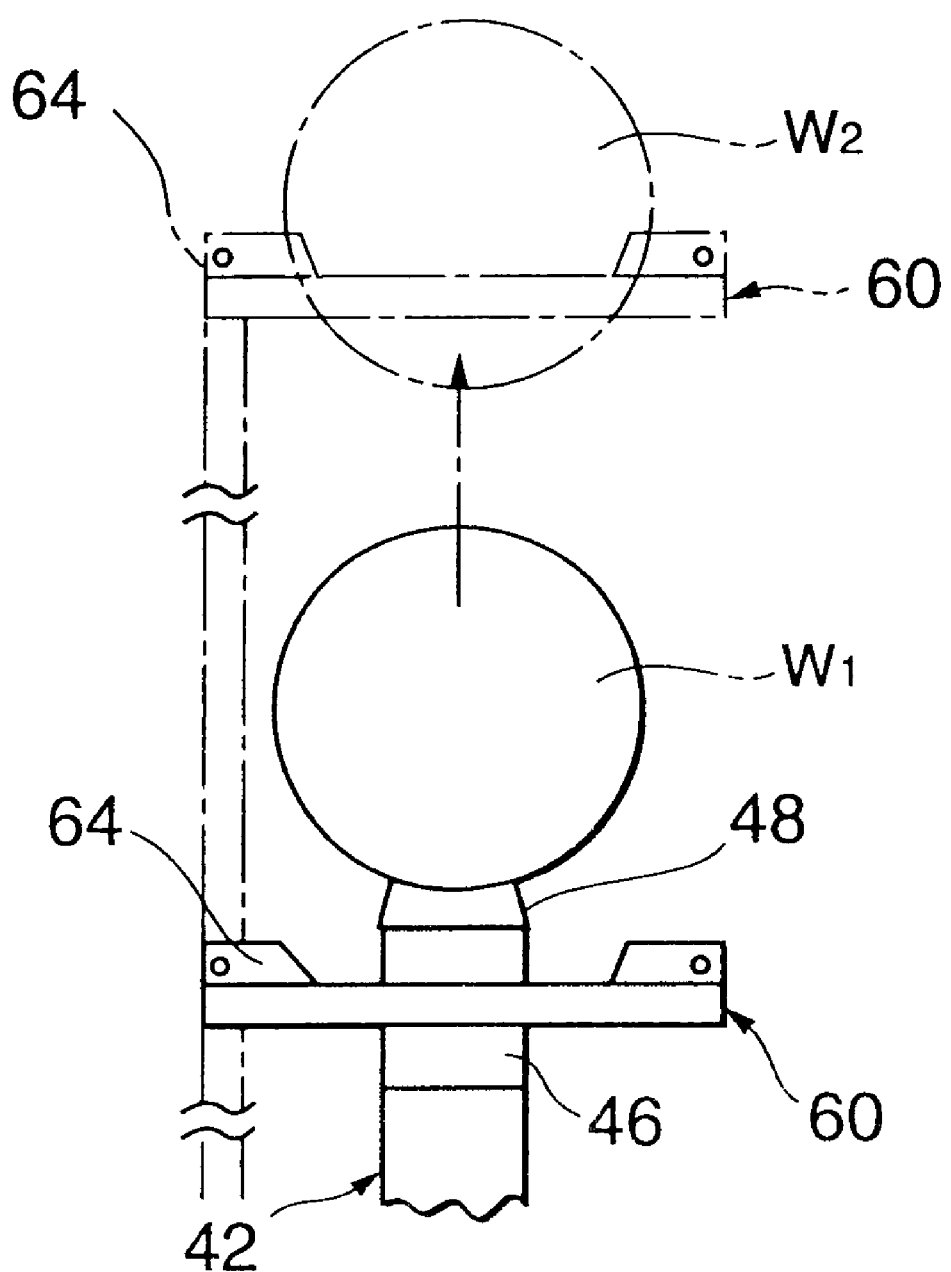
FIG. 11 is a schematic front view explaining a third operation of the substrate arranging apparatus shown in FIG. 4.

In this state, the second support mechanism 60 is held below the first support members 48 and 49 as shown in FIG. 10, and the opposite second support members 64 are set in the closed position. Subsequently, the second support mechanism 60 is raised by the cylinder actuator 65 from the lower position indicated by continuous lines to the upper position indicated by alternate long and short dash lines in FIG. 11. Consequently, the fifty uncleaned wafers W are divided into halves, i.e., two groups by the grooves 66 and the projections 67 of the opposite second support members 64; that is, the wafers W corresponding to the grooves 66 of the opposite second support members 64 remain on the first support members 48 and 49, and the wafers W corresponding to the projections 67 are held in the holding grooves 59 of the projections 67.

Thus, for example, the twenty-five odd wafers W, i.e., alternate ones of the fifty wafers W, are held on the second support members 64. Thus, the fifty wafers 50 are divided into halves or into two groups; the twenty-five even wafers W1 are supported on the first support members 48 and 49, and the twenty-five odd wafers W2 are supported on the second support members 64 positioned above the first support members 48 and 49. The wafers W1 are supported on the first support members 48 and 49 and the wafers W2 are supported on the second support members 64 at equal intervals 2L.

Figure 12:
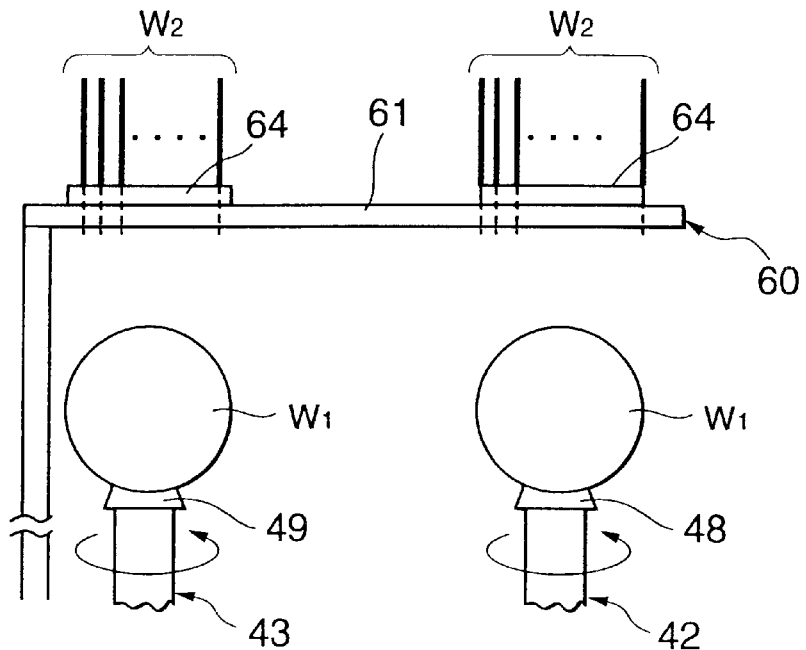
FIG. 12 is a schematic front view explaining a fourth operation of the substrate arranging apparatus shown in FIG. 4.
Figure 13:
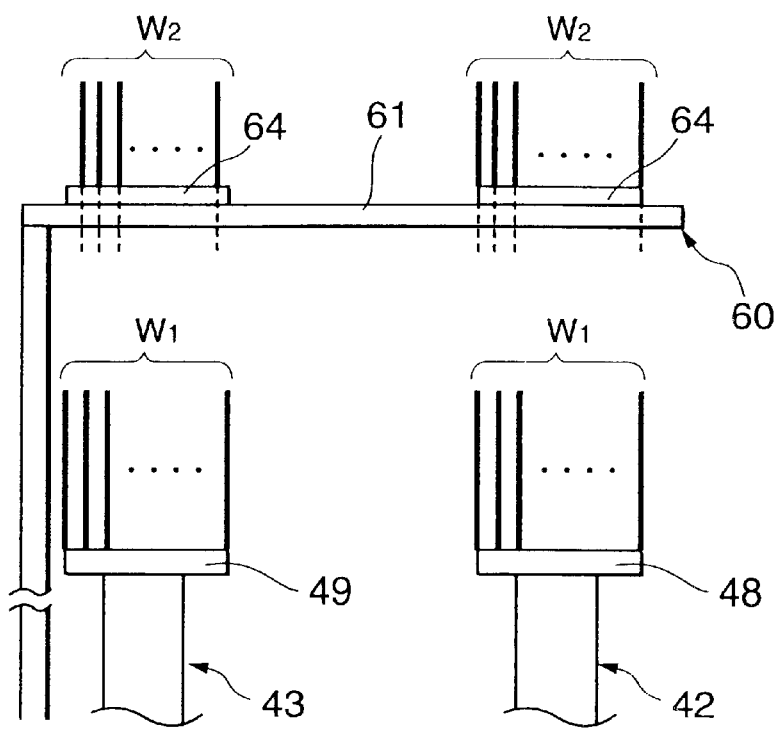
FIG. 13 is a schematic front view explaining a fifth operation of the substrate arranging apparatus shown in FIG. 4.
Figure 14:
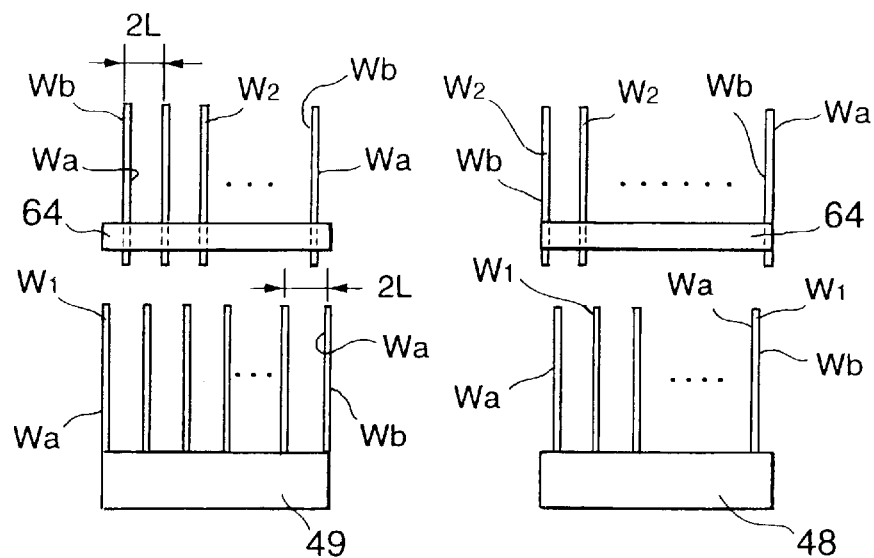
FIG. 14 is a diagrammatic view explaining the arrangement of wafers in FIG. 13.

The rotating mechanisms 46 and 47 are then driven to turn the first support mechanisms 42 and 43 through an angle of 180° as shown in FIG. 12 to arrange the wafers W1 and W2 in a positional relation shown in FIG. 13. Then, the wafers W1 and the wafers W2 are disposed at intervals with their front surfaces Wa directed in the same directions as shown typically in FIG. 14. In FIG. 14, the front surfaces Wa of the wafers W2 are directed to the light and the back surfaces Wb of the same are directed to the left, while the front surfaces Wa of the wafers W1 are directed to the left and the back surfaces Wb of the same are directed to the right because the wafers W1 are turned through an angle of 180° relative to the wafers W2. Thus, the orientation of the wafers W2 is the orientation as that of the orientation in the carriers C, and the orientation of the wafers W1 is opposite to that of the orientation in the carriers C. Both the wafers W1 and the wafers W2 are arranged at equal intervals 2L. The rotating mechanisms 46 and 47 could be provided at the position indicated at 46' in FIG. 9 and at the position indicated at 47' in FIG. 5, respectively.

Figure 15:
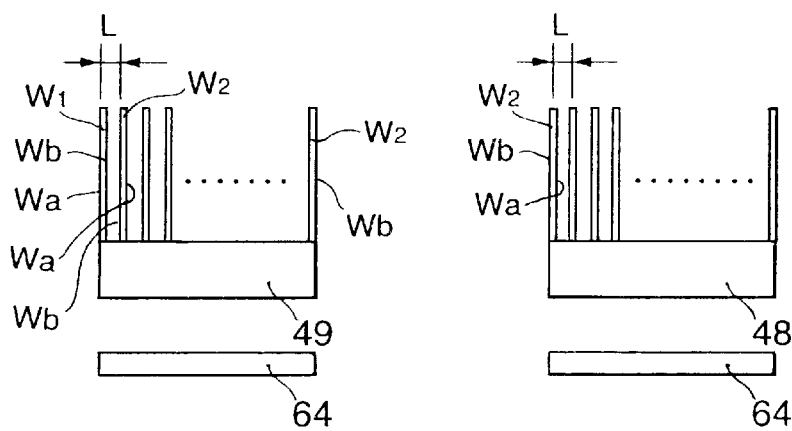
FIG. 15 is a diagrammatic view explaining the arrangement of wafers when the second support mechanism is lowered from a position shown in FIG. 14.

Subsequently, the second support mechanism 60 is lowered relative to the first support mechanisms 42 and 43 from the position shown in FIG. 14. Consequently, the wafers W1 and W2 are arranged alternately on the first support members 48 and 49 with the front surfaces Wa of adjacent wafers W1 and W2 facing each other and the back surfaces Wb of adjacent wafers W1 and W2 facing each other as shown in FIG. 15, and the twenty-five wafers W1 and W2 are held alternately at the equal intervals L on each of the first support members 48 and 49.

Figure 16:
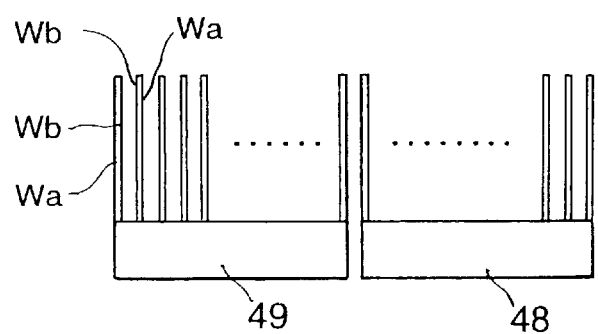
FIG. 16 is a perspective view of a wafer chuck included in the cleaning system of FIG. 1.

Then, the motor 56 is actuated to move the first support mechanism 42 toward the first support mechanism 43 to bring the first support member 48 to a position close to the first support member 49 as shown in FIG. 16. In the state shown in FIG. 16, the fifty wafers W1 and W2 are arranged alternately with the front surfaces Wa facing adjacent front surfaces Wa, and the back surfaces Wb facing adjacent back surfaces Wb, respectively. The fifty wafers W thus arranged can be simultaneously held by the wafer chuck 28. Subsequently, the fifty wafers W are held simultaneously by the wafer chuck 28 of the conveying device 25, and the wafer chucks 29 and 30 are used sequentially to convey the fifty wafers W simultaneously from the substrate arranging apparatus 6 through the processing tanks of the cleaning unit 3 including the cleaning chemical liquid tank 14 and the rinsing water tank 15 to the substrate arranging apparatus 9 of the delivery section 4.

As mentioned above, the substrate arranging apparatus 6 in the first embodiment is constructed by structurally integrally combing a loading mechanism and an arranging mechanism necessary for arranging the wafers in a front-to-front and back-to-back arrangement, and the substrate arranging apparatus 6 needs a reduced space for installation, curtails time necessary for conveying the wafers W and improves the throughput of the cleaning system. In the substrate arranging apparatus 6 in the first embodiment, the fifty wafers W are rearranged so that the front surfaces Wa of adjacent wafers W face each other and the back surfaces Wb of adjacent wafers W face each other by the two sets of first support mechanisms 42 and 43 and the second support mechanism 60.

Figure 19:
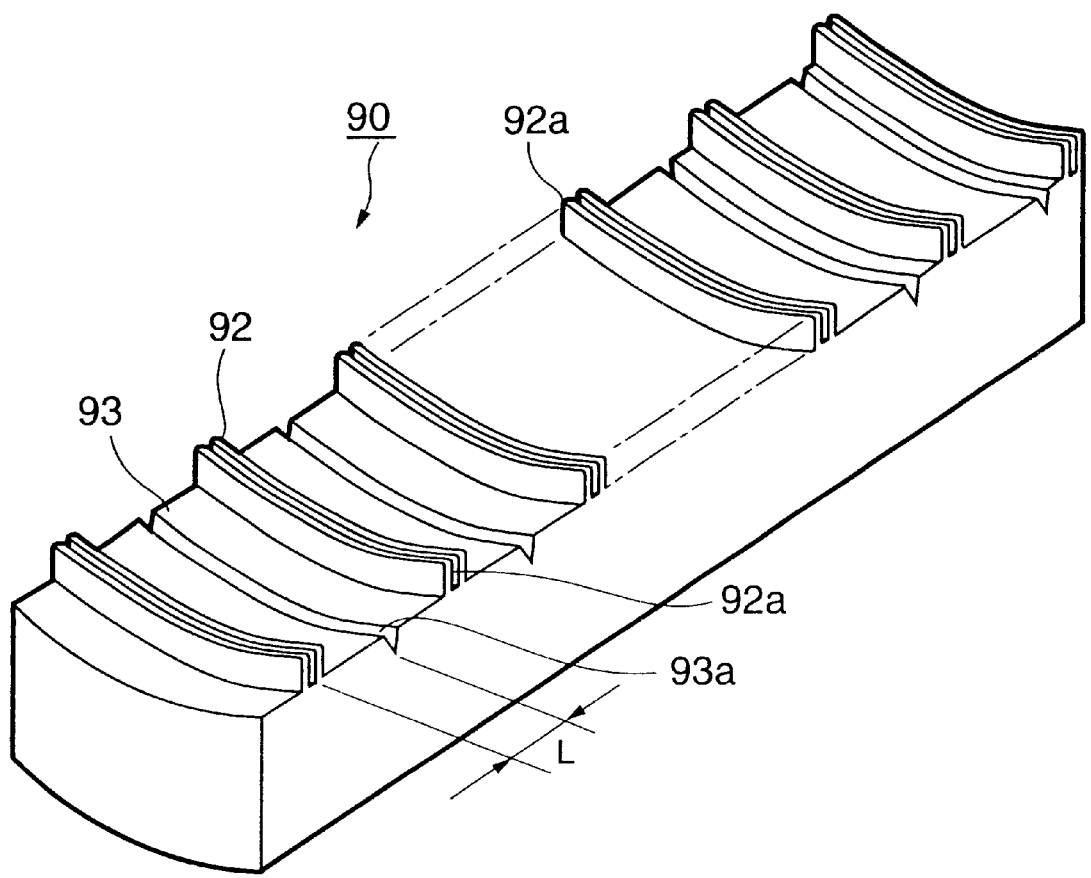
FIG. 19 is an enlarged perspective view of a second support member employed in a substrate arranging apparatus in a second embodiment of the present invention.

A substrate arranging apparatus in a second embodiment of the present invention is able to rearrange wafers W in the foregoing arrangement by using the wafer chuck 28 of the conveying device 25 and two first support members 90 shown in FIG. 19 instead of the first support mechanisms 42 and 43 and the second support mechanism 60. The substrate arranging apparatus in the second embodiment will be described hereinafter, in which component parts similar in function and construction to those of the substrate rearranging apparatus in the first embodiment are designated by the same reference characters and the description thereof will be omitted to avoid duplication.

Figure 17:
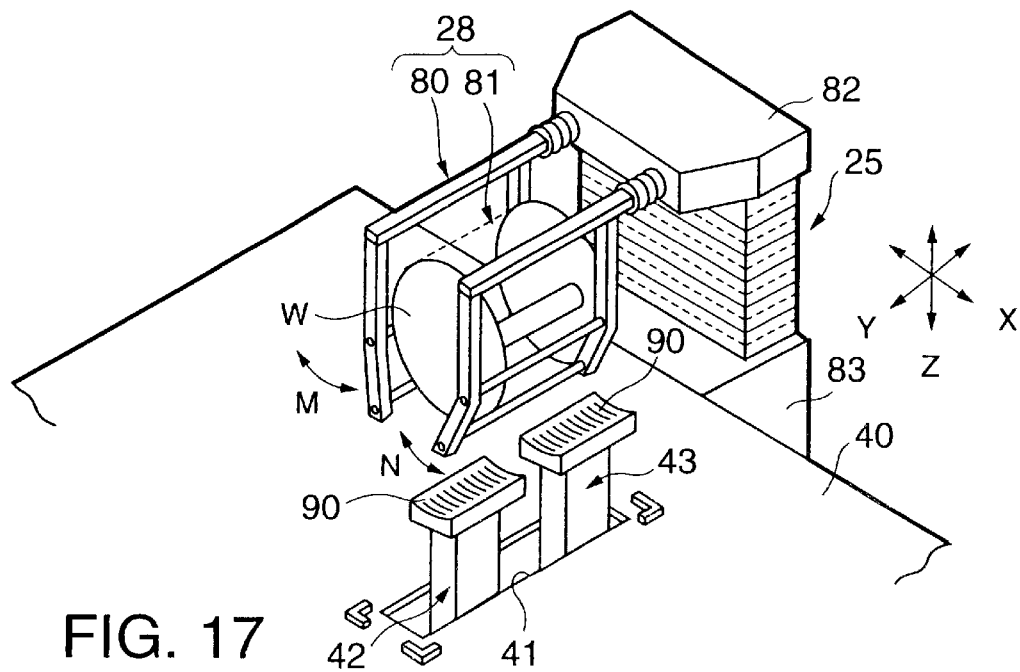
FIG. 17 is a perspective view showing a wafer chuck provided in the cleaning system.
Figure 18:
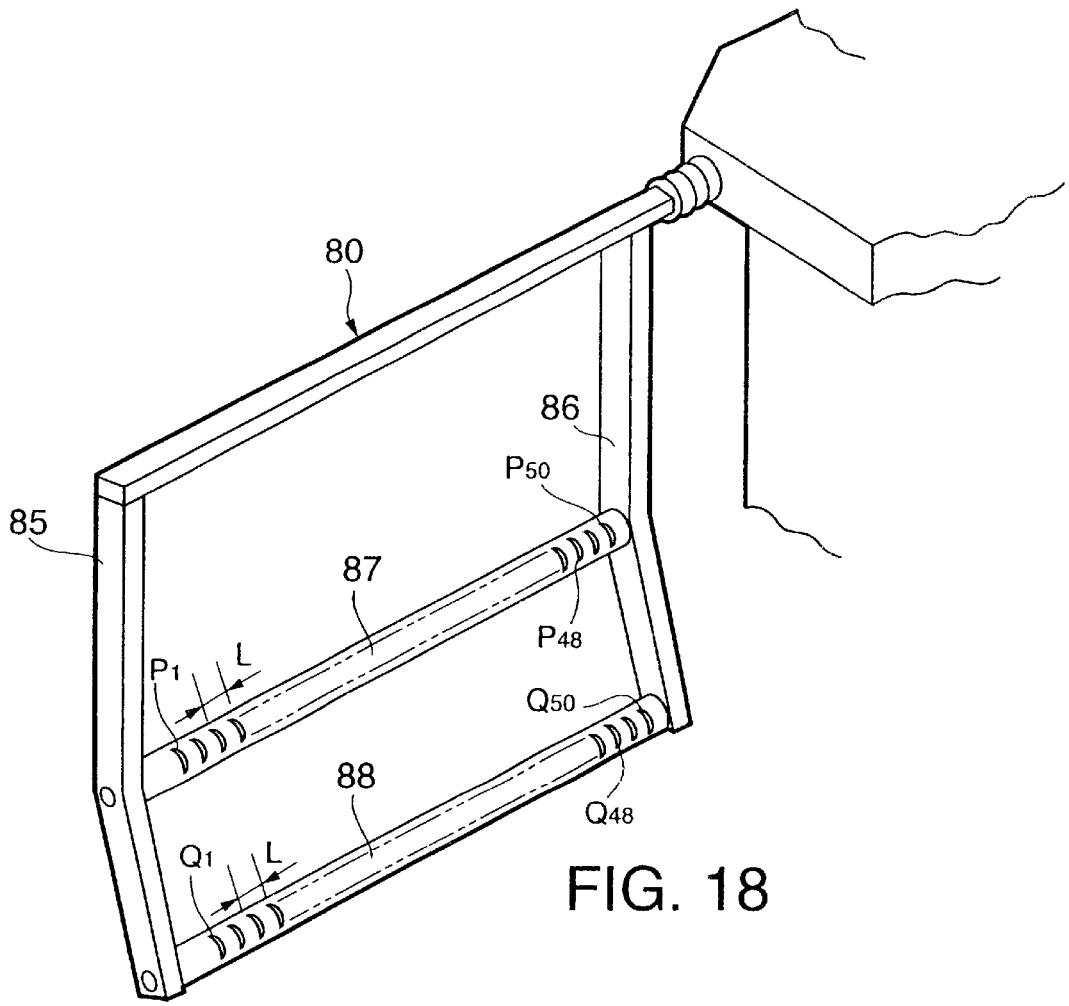
FIG. 18 is an enlarged view of a grasping member included in the wafer chuck of FIG. 17.

Referring to FIG. 17, the wafer chuck 28 has a pair of grasping members 80 and 81 respectively having mirror image forms and supported on a support head 82 of the conveying device 25. The support head 82 is movable vertically, i.e., along a Z-axis, by a driving mechanism 83, and the wafer chuck 28 can be driven for back-and-forth movement, i.e., movement along a Y-axis, by a driving mechanism, not shown, built in the support head 82. The driving mechanism 83 is mounted on a movable base 84 (FIG. 1) movable along the X-axis. The grasping members 80 and 81 can be turned in the directions of the arrows M and N. As shown in FIG. 18, grasping rods 87 and 88 are extended horizontally one over the other between and fixed to swing arms 85 and 86. The upper grasping rod 87 is provided with fifty grasping grooves P1 to P50, and the lower gasping rod 88 is provided with grasping grooves fifty Q1 to Q50 at equal intervals L. The grasping members 80 and 81 are turned toward each other with peripheral parts of fifty wafers W inserted in the grasping grooves P1 to P50 of the grasping rod 87 and in the grasping grooves Q1 to Q50 of the grasping rod 88 to grasp the wafers W by the wafer chuck 28.

The two first support members 90 employed in the second embodiment are similar in size to the first support members 48 and 49. The first support members 90 are able to pass vertically through the lower open ends 11 of the carriers C and the central opening 41 of the table 40.

As shown in FIG. 19, each of the first support members 90 is provided in its upper surface with ridges 92 and furrows 93, which are arranged alternately. The ridges 92 and the furrows 93 are provided with grooves 92a and 93a, respectively. The grooves 92a and 93a receive peripheral portions of wafers W therein to hold the wafers W on the first support member 90. When the table 40 mounted with two carriers C is lowered relative to the first support members 90, fifty wafers W contained in the two carriers C are transferred to the first support members 90. The twenty-five odd wafers W3 among the fifty wafers W are held in the grooves 92a of the ridges 92, and the twenty-five even wafers W4 among the fifty wafers W are held in the grooves 93a of the furrows 93. The odd wafers W3 and the even wafers W4 are arranged alternately in parallel to each other at equal intervals L. The first support members 90, similarly to the first support members 48 and 49 employed in the first embodiment, are supported so as to be turnable through an angle of 180° together with the wafers W held thereon. One of the first support members 90 can be moved toward the other first support member 90.

The operation of the substrate arranging apparatus 6 in the second embodiment provided with the wafer chuck 28 and the first support members 90 will be described. Two carriers C each containing twenty-five uncleaned wafers W are conveyed from the carrier support table 5 onto the table 40 of the substrate arranging apparatus 6.

Figure 20:
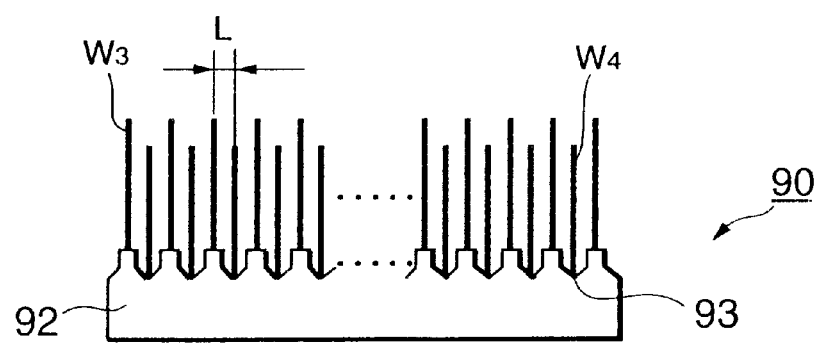
FIG. 20 is a diagrammatic view explaining a state where wafers are held on the second support member of FIG. 19.
Figure 21:
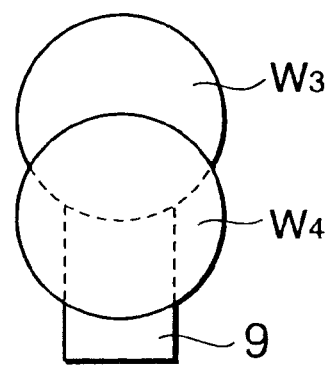
FIG. 21 is a diagrammatic view explaining a first operation of the substrate arranging apparatus in the second embodiment.

The table 40 supporting the two carriers C thereon is lowered to transfer the twenty-five wafers W to each of the first support members 90. As shown in FIGS. 20 and 21, the wafers W3 are supported in the grooves 92a of the ridges 92 at a higher level, and the wafers W4 are supported in the grooves 93a of the furrows 93 at a lower level. The wafers W3 and W4 are arranged alternately. For example, the wafers W3 are odd ones and the wafers W are even ones. Intervals between the odd wafers W3 and those between the even wafers W4 are 2L. At this stage, the wafer chuck 28 is positioned above the first support members 90. The two first support members 90 are then caused to move close to each other by a drive mechanism similar to the drive mechanism including the motor 56 shown in FIG. 4, in the same manner as shown in FIG. 16.

Figure 22:
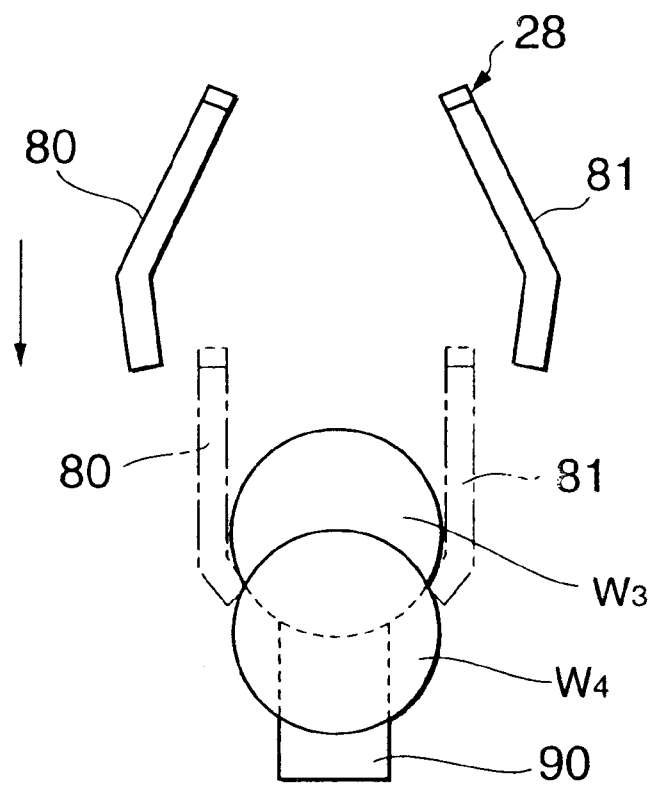
FIG. 22 is a diagrammatic view explaining a second operation of the substrate arranging apparatus in the second embodiment.

Then, the wafer chucks 28 with its grasping members 80 and 81 turned away from each other is lowered from an upper position indicated by continuous lines to a tower position, i.e., a wafer grasping position, indicated by alternate long and short dash lines in FIG. 22. Then, the grasping members 80 and 81 are turned toward each other to hold simultaneously the twenty-five odd wafers W3 held on the first support members 90. In this state, peripheral portions of the odd wafers W3 are received in the odd grasping grooves P and Q.

Figure 23:
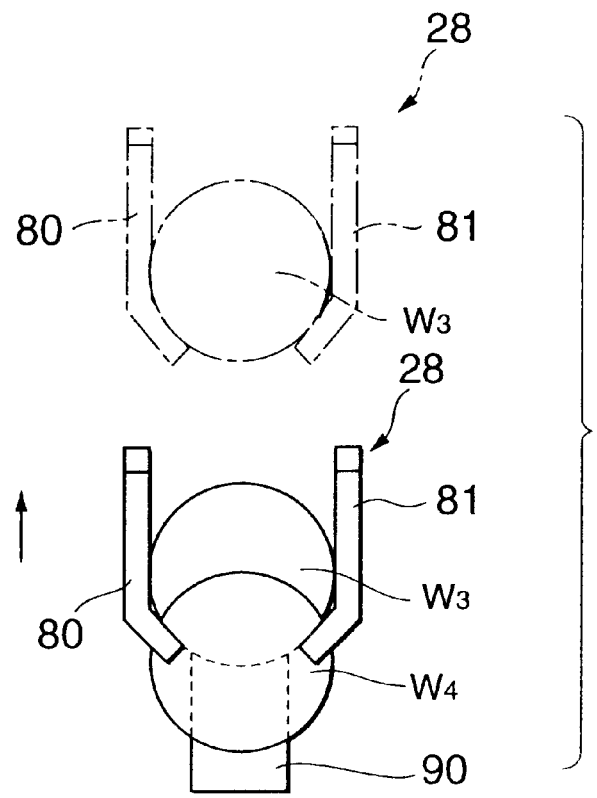
FIG. 23 is a diagrammatic view explaining a third operation of the substrate arranging apparatus in the second embodiment.
Figure 24:
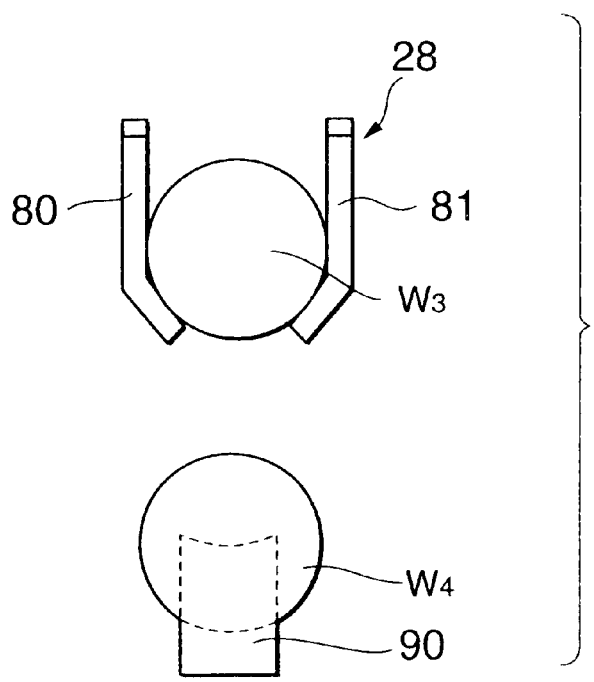
FIG. 24 is a diagrammatic view explaining a fourth operation of the substrate arranging apparatus in the second embodiment.

Thus, the wafer chuck 28 grasps the twenty-five odd wafers W at the lowered position indicated by continuous lines in FIG. 23 and is raided to the upper position indicated by alternate long and short dash lines in FIG. 23. FIG. 24 shows the wafer chuck 28 holding the odd wafers W3 is held at the upper position. The twenty-five even wafers W4 remain on the first support members 90 as shown in FIG. 24. Next, the two first support members 90 are caused to move apart again by the above mentioned drive mechanism.

Subsequently, the first support mechanisms 42 and 43 (FIG. 7) are turned through an angle of 180° from the state of FIG. 24 to the state shown in FIG. 25a. Consequently, the even wafers W4 supported on the first support members 90 with their front surfaces Wa directed, for example, to the right, as viewed in FIG. 25b are reversed so that their front surfaces Wa are directed to the left as shown in FIG. 25c. The turning of the first support members 90 can be performed without interference therebetween since the first support members are apart from each other. After the turning, the first support members 90 are moved toward each other again by the drive mechanism.

Then, the wafer chuck 28 holding the odd wafers W3 is lowered from the upper position indicated by continuous lines to the lower position, i.e., a position where the odd wafers W3 were held initially on the ridges 92 of the first support members 90, indicated by alternate long and short dash lines in FIG. 26. The grasping members 80 and 81 are then turned away from each other to transfer the odd wafers W3 from the wafer chuck 28 to the first support members 90. The twenty-five wafers W3 and W4 are arranged alternately at equal intervals L on each of the first support members 90 with the respective front surfaces Wa of adjacent odd wafer W3 and even wafer W4 facing each other and the respective back surfaces Wb of adjacent odd wafer W3 and even wafer W4 facing each other.

Figure 27:
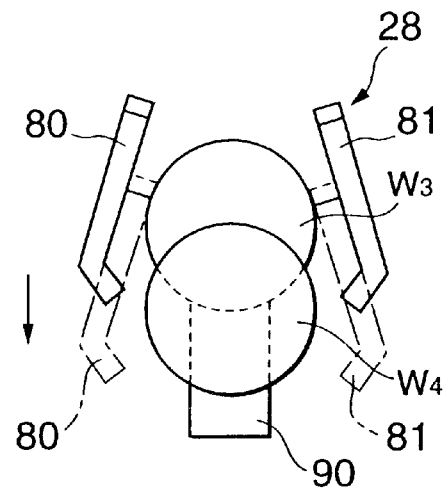
FIG. 27 is a diagrammatic view explaining a seventh operation of the substrate arranging apparatus in the second embodiment.
Figure 28:
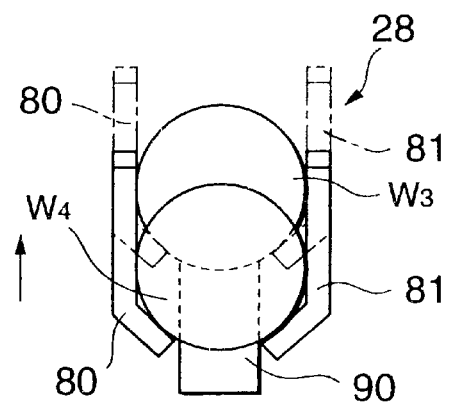
FIG. 28 is a diagrammatic view explaining an eighth operation of the substrate arranging apparatus in the second embodiment.
Figure 29:
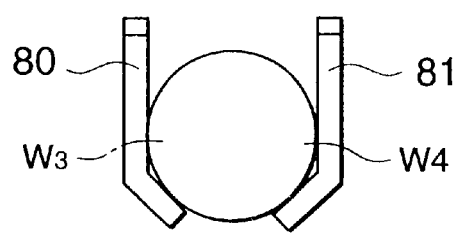
FIG. 29 is a diagrammatic view explaining a ninth operation of the substrate arranging apparatus in the second embodiment.

Then, the wafer chuck 28 with its grasping members 80 and 81 turned away from each other is lowered further from the lower position indicated by alternate long and short dash lines in FIG. 26 (a position indicated by continuous lines in FIG. 27) to a lowermost position indicated by alternate long and short dash lines in FIG. 27. When the wafer chuck 28 is positioned at the lowermost position indicated by alternate long and short dash lines in FIG. 27, the grasping members 80 and 81 are able to grasp the even wafers W4. Then, the grasping members 80 and 81 are turned toward each other to grasp the even wafers W4 as shown in FIG. 28. In this state, peripheral portions of the even wafers W4 are received in even grasping grooves P and Q.

Subsequently, the wafer chuck 28 holding the even wafers W4 moves upward. When the wafer chuck 28 passes the position indicated by alternate long and short dash lines in FIG. 28 during its upward movement, peripheral portions of the odd wafers W3 are received in the odd grasping grooves P and Q of the grasping members 80 and 81, and both the odd wafers W3 and the even wafers W4, i.e. all the fifty wafers W, are held on the wafer chuck 28 in a front-to-front and back-to-back arrangement.

Thereafter, the wafer chucks 29 and 30, which are similar to the wafer chuck 28, are used sequentially to convey the fifty wafers W simultaneously from the substrate arranging apparatus 6 through the processing tanks in the cleaning section 3 including the cleaning chemical liquid tank 14 and the rinsing water tank 15 to the substrate arranging apparatus 9 of the delivery section 4.

The substrate arranging apparatus 9 has the same construction as the substrate arranging apparatus 6. Therefore, if the substrate arranging apparatus 9 is operated in the reverse order to the operation of the substrate arranging apparatus 6, the arrangement of the wafers can be returned to the original front-to-back arrangement and the wafers of the original arrangement can be returned into the carrier.

Thus, the substrate arranging apparatus 6 in the second embodiment uses the wafer chuck 28 and the first support members 90 in combination and is constructed by structurally integrally combining a loading mechanism and an arranging mechanism. Since the second embodiment employs the wafer chuck 28 originally included in the cleaning system instead of the second support mechanism 60 employed in the first embodiment, the substrate arranging apparatus in the second embodiment has a further compact construction, the substrate arranging apparatus 6 needs a reduced space for installation, curtails time necessary for conveying the wafers W and improves the throughput of the cleaning system.

A substrate arranging apparatus in a third embodiment of the present invention will be described hereafter, in which component parts like or corresponding to those of the foregoing substrate arranging apparatus embodying the present invention will be designated by the same reference characters and the description thereof will be omitted. Whereas the substrate arranging apparatuses in the first and the second embodiment of the present invention rearrange the wafers in the substrate arranging section, the substrate arranging apparatus in the third embodiment rearranges wafers in a face-to-face and back-to-back arrangement on the carrier support table 5.

Figure 30:
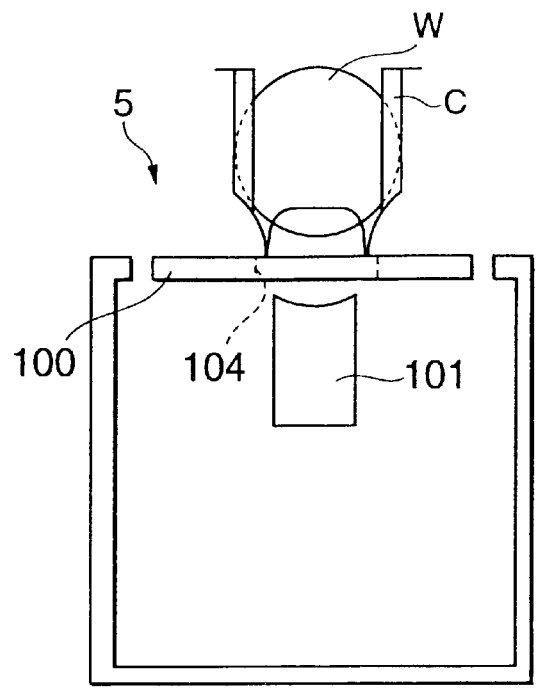
FIG. 30 is a diagrammatic view explaining a first operation of a substrate arranging apparatus in a third embodiment of the present invention.
Figure 31:
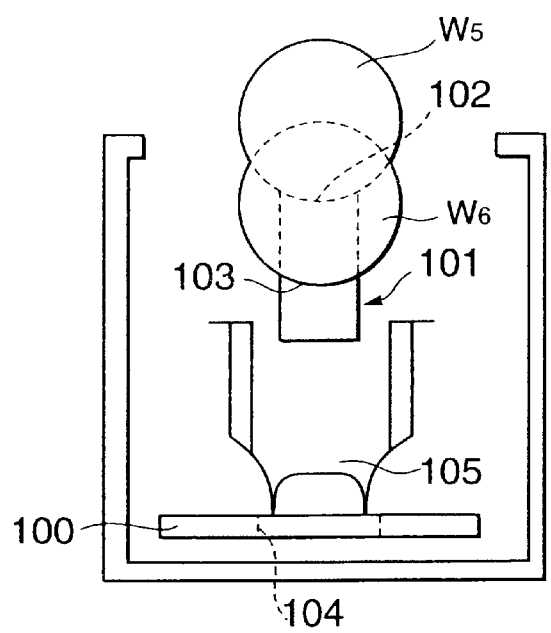
FIG. 31 is a diagrammatic view explaining a second operation of the substrate arranging apparatus in the third embodiment.

The operation of the substrate arranging apparatus in the third embodiment will be described. Referring to FIG. 30, two carriers C each containing twenty-five uncleaned wafers W are conveyed onto a stage 100, i.e., the top plate of the carrier support table 5, by, for example, a transport robot. After the carriers C have been positioned, the stage 100 is lowered. First support members 101 disposed in the carrier support table 5 rises relative to the stage 100 through a central opening formed in the stage 100 and the open lower ends of the carriers C to hold thereon the twenty-five wafers W contained in each of the carriers C. The first support members 101 are similar in construction as the first support hand 90 shown in FIG. 19. The wafers W5 are supported on ridges 102 of the first support members 101 and the wafers W6 are supported in the furrows 103 of the same as shown in FIG. 31.

Figure 32:
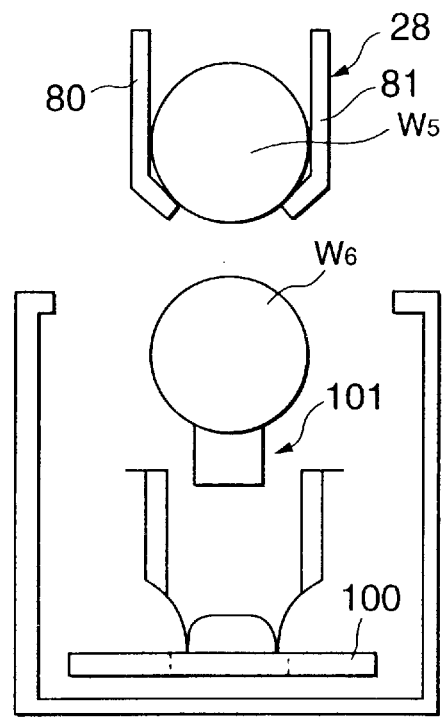
FIG. 32 is a diagrammatic view explaining a third operation of the substrate arranging apparatus in the third embodiment.

Then, the grasping members 80 and 81 of the wafer chuck 28 waiting above the first support members 101 are operated to grasp the wafers W5. The conveying device 25 (FIG. 1) on which the wafer chuck 28 is mounted, is movable to the region of the carrier support table 5. Thus the wafers W5 are lifted up and the wafers W6 remain on the first support members 101 as shown in FIG. 32. Then, the first support members 101 are turned through an angle of 180° to reverse the wafers W6.

Subsequently, the wafer chuck 28 is lowered, the grasping members 80 and 81 are turned away from each other to place the wafers W5 again on the first support members 101. Then, the wafer chuck 28 is lowered further, the grasping members 80 and 81 are turned toward each other, and the wafer chuck 28 is raised to hold both the wafers W5 and W6 in a front-to-front and back-to-back arrangement in which the respective front surfaces Wa of adjacent wafers W face each other.

The first support members 101 can be moved toward and away from each other in the same way as in the second embodiment. The carrier support table 5 is provided with a drive mechanism (not shown) similar to the drive mechanism of FIG. 4, for carrying out the above movement of the first support members 101.

After thus grasping the wafers W by the wafer chuck 28, the wafers W are subjected sequentially to predetermined cleaning processes in the processing tanks including the cleaning chemical liquid tank 14 and the rinsing water tank 15, and the wafers W are conveyed to the substrate arranging apparatus 9 of the delivery section 4 by using the wafer chucks 29 and 30 similar to the wafer chuck 28.

As is apparent from the foregoing description the substrate arranging apparatus in the third embodiment is capable of arranging the wafers W in a front-to-front and back-to-back arrangement in which the respective front surfaces Wa of adjacent wafers W face each other on the carrier support table 5. Thus, the carrier support table 5 and the loading mechanism can be integrally combined and the throughput of the cleaning system is improved accordingly.

Although the invention has been described as applied to the substrate arranging apparatus for arranging the wafers W, the present invention is applicable to a panel arranging apparatus for arranging, for example, LCD panels.

Figure 33:
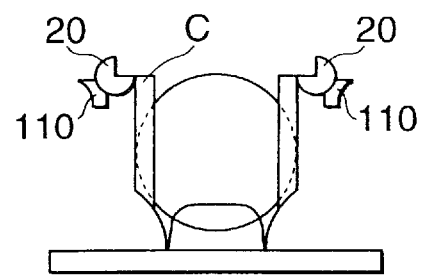
FIG. 33 is a diagrammatic view explaining a first operation of an arm in a modification of an arm included in a conveying device.
Figure 34:
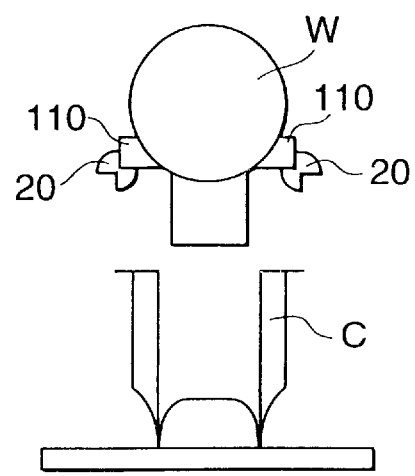
FIG. 34 is a diagrammatic view explaining a second operation of the arm shown in FIG. 33.

As shown in FIGS. 33 and 34, the arms 20 of the conveying device 7 for carrying carriers C from the carrier support table 5 to the substrate arranging apparatus 6 may be used in combination with second support members 110. More specifically, the second support members 110 are attached to the arms 20, and the arms 20 are supported so as to be able to be turned through an angle of 180°. When carrying carriers C, the second support members 110 are turned away from each other and the carriers C are supported on the arms 20 as shown in FIG. 33. When supporting wafers W pushed up from the carrier C by the second support members 110, the arms 20 are turned so that the second support members 110 are turned toward each other and support the wafers W by their peripheral parts. This arrangement is effective in reducing the number of component parts of the substrate arranging apparatus.

Although the invention has been described in its preferred embodiments with a certain degree of particularity, obviously many changes and variations are possible therein. It is therefore to be understood that the invention may be practiced otherwise than as specifically described herein without departing from the scope and spirit thereof.

What is claimed is:

1. A substrate arranging apparatus wherein a carrier is conveyed to the apparatus with a plurality of substrates held therein in a vertical attitude in a face-to-face disposition at constant intervals, said carrier having an upwardly and downwardly open internal through space, said apparatus comprising:

a table having an upper surface with a vertical through opening, said upper surface being configured to support thereon said carrier with said internal through space of the carrier positioned above the vertical through opening of the table in a vertical alignment;

a first horizontal support member for supporting substrates in a vertical attitude in a face-to-face disposition at constant intervals;

second horizontal support members provided on opposite outer sides of said first horizontal support member, respectively;

a first support mechanism that moves one of said first horizontal support member and said table vertically relative to each other such that said first horizontal support member moves vertically through and relative to said vertical through opening of the table and through and relative to said internal through space of the carrier supported on said table;

a second support mechanism that moves said second horizontal support members vertically such that when the second horizontal support members are raised, the second horizontal support members engage only a first group of substrates among the substrates that are being supported by said first horizontal support member, and raise only the first group of substrates relative to a second group of substrates other than said first group;

a rotating device that rotates said first horizontal support member which is supporting the second group of substrates through an angle of 180° relative to said second horizontal support members while said first group of substrates is being raised relative to the second group; and said second horizontal support members being movable downward after rotating the first horizontal support member to bring back said once raised first group of substrates to said position on said first horizontal support member in such a manner as to cause the substrates of the first group to be interposed between adjacent substrates of the second group, whereby all of the substrates on the first horizontal support member are disposed alternately with front surfaces of the substrates of the first group facing front surfaces of adjacent substrates of the second group and with back surface of the substrates of the first group facing back surface of adjacent substrates of the second group.

2. The substrate arranging apparatus according to claim 1, wherein said second support mechanism includes oppositely disposed comb-shaped support members having alternately arranged projections and grooves, said projections being positioned and shaped to engage only said first group of substrates when the second support mechanism is moved upward and said grooves being positioned and shaped to be free from engagement with both said first and second groups of substrates.

3. The substrate arranging apparatus according to claim 2, wherein each of said projections has an upwardly directed substrate holding groove.

4. The substrate arranging apparatus according to claim 2, wherein said comb-shaped support members move apart from each other to allow said comb-shaped support members to move upward without interference as the second support mechanism is moved upward.

5. The substrate arranging apparatus according to claim 2, wherein said second support mechanism has a vertically movable frame surrounding the first support mechanism and said oppositely disposed comb-shaped support members are fixed on the frame.

6. The substrate arranging apparatus according to claim 1, wherein two adjacent horizontal support members of the first support mechanism are disposed in a line and are movable toward and apart from each other.

7. The substrate arranging apparatus according to claim 1, wherein at least one horizontal support member of the first support mechanism is formed with alternately disposed ridges and furrows on an upper surface thereof, said ridges and furrows each having a groove for receiving each substrate therein, so that substrates supported by said support member are in alternately raised and lowered positions on said support member, the substrates at the raised position constituting said first group and the substrates at the lowered position constituting said second group.

8. The substrate arranging apparatus according to claim 7, wherein said second support mechanism includes a grasping mechanism having a pair of grasping members for grasping the first group of substrates.

9. The substrate arranging apparatus according to claim 8, said grasping mechanism for grasping the second group of substrates together with the first group of the substrates, after all of the substrates on the support member have been disposed alternately with front surfaces of the substrates of the first group facing front surfaces of adjacent substrates of the second group and with back surfaces of the substrates of the first group facing back surfaces of adjacent substrates of the second group.

10. The substrate arranging apparatus according to claim 8, wherein said grasping mechanism is s conveying mechanism for conveying at least one carrier to said table.

11. The substrate arranging apparatus according to claim 8, wherein said grasping mechanism is a conveying mechanism for conveying the substrates to a processing unit.

* * * * *